US010354922B1

(12) United States Patent
De Silva et al.

(10) Patent No.: US 10,354,922 B1
(45) Date of Patent: Jul. 16, 2019

(54) SIMPLIFIED BLOCK PATTERNING WITH WET STRIPPABLE HARDMASK FOR HIGH-ENERGY IMPLANTATION

(71) Applicant: INTERNATIONAL BUSINESS MACHINES CORPORATION, Armonk, NY (US)

(72) Inventors: Ekmini Anuja De Silva, Slingerlands, NY (US); Indira Seshadri, Niskayuna, NY (US); Romain Lallement, Troy, NY (US); Nelson Felix, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/855,383

(22) Filed: Dec. 27, 2017

(51) Int. Cl.
| | | |
|---|---|---|
| H01L 21/324 | (2006.01) | |
| H01L 21/8238 | (2006.01) | |
| H01L 21/265 | (2006.01) | |
| H01L 29/66 | (2006.01) | |
| H01L 29/32 | (2006.01) | |
| H01L 21/8234 | (2006.01) | |
| H01L 21/266 | (2006.01) | |
| H01L 21/311 | (2006.01) | |
| H01L 21/3105 | (2006.01) | |

(Continued)

(52) U.S. Cl.
CPC .... *H01L 21/823431* (2013.01); *H01L 21/266* (2013.01); *H01L 21/26513* (2013.01); *H01L 21/3081* (2013.01); *H01L 21/31058* (2013.01); *H01L 21/31111* (2013.01); *H01L 21/823418* (2013.01); *H01L 21/3065* (2013.01); *H01L 21/823437* (2013.01); *H01L 21/823475* (2013.01)

(58) Field of Classification Search
CPC ....... H01L 21/823814; H01L 21/26513; H01L 21/26506; H01L 21/324; H01L 29/66795; H01L 21/823821; H01L 29/32; H01L 29/1095; H01L 29/1083; H01L 29/1037; H01L 29/0847; H01L 27/0924; H01L 29/167; H01L 21/26593
See application file for complete search history.

(56) References Cited

U.S. PATENT DOCUMENTS

| | | |
|---|---|---|
| 6,399,446 B1 | 6/2002 | Rangarajan et al. |
| 7,887,711 B2 | 2/2011 | Buchanan et al. |
| 8,080,475 B2 | 12/2011 | RamachandraRao et al. |

(Continued)

OTHER PUBLICATIONS

Anuja De Silva et al., Development of TiO2 containing hardmasks through Plasma Enhanced Atomic Layer Deposition, Advances in Patterning Materials and Processes, Mar. 2017.

(Continued)

*Primary Examiner* — Brian Turner
(74) *Attorney, Agent, or Firm* — Tutunjian & Bitetto, P.C.; Vazken Alexanian

(57) ABSTRACT

Semiconductor devices and methods of forming the same include forming a wet-strippable hardmask over semiconductor fins. The wet-strippable hardmask is anisotropically etched away in a first device region. At least one semiconductor fin is doped in the first device region. The wet-strippable hardmask is isotropically etched away in a second device region. Semiconductor devices are formed from the fins in the first and second device regions.

19 Claims, 5 Drawing Sheets

(51) Int. Cl.
*H01L 21/308* (2006.01)
*H01L 21/3065* (2006.01)

(56) References Cited

U.S. PATENT DOCUMENTS

| | | | |
|---|---|---|---|
| 8,426,319 B2 | 4/2013 | Mistkawi et al. | |
| 8,759,220 B1* | 6/2014 | Ogihara | G03F 7/0752 |
| | | | 257/E21.159 |
| 9,201,305 B2 | 12/2015 | Rahman et al. | |
| 9,293,345 B2 | 3/2016 | He et al. | |
| 9,425,053 B2 | 8/2016 | Glodde et al. | |
| 2005/0001217 A1* | 1/2005 | Kusumoto | H01L 21/046 |
| | | | 257/77 |
| 2009/0203187 A1* | 8/2009 | Nakai | H01L 21/76243 |
| | | | 438/423 |
| 2013/0260531 A1* | 10/2013 | Choi | H01L 21/76224 |
| | | | 438/424 |
| 2014/0252477 A1* | 9/2014 | Tseng | H01L 29/66795 |
| | | | 257/347 |
| 2015/0044842 A1* | 2/2015 | Wang | H01L 29/665 |
| | | | 438/296 |
| 2015/0287826 A1* | 10/2015 | Cheng | H01L 29/7848 |
| | | | 257/20 |
| 2015/0340292 A1* | 11/2015 | Dong | H01L 21/823821 |
| | | | 438/199 |
| 2016/0204039 A1* | 7/2016 | Togo | H01L 21/823814 |
| | | | 257/369 |
| 2017/0221704 A1 | 8/2017 | Mohanty et al. | |

OTHER PUBLICATIONS

Y. Kikuchi et al., Improvement of the CMOS characteristics of bulk Si FinFETs by high temperature ion implantation, 2016 IEEE International Electron Devices Meeting (IEDM), San Francisco, CA, Dec. 2016.

Huirong Yao et al., Progress in Spin-on Metal Oxide Hardmask Materials for Filling Applications, Advances in Patterning Materials and Processes, Mar. 2015.

* cited by examiner

SIMPLIFIED BLOCK PATTERNING WITH WET STRIPPABLE HARDMASK FOR HIGH-ENERGY IMPLANTATION

BACKGROUND

Technical Field

The present invention generally relates to semiconductor fabrication and, more particularly, to the use of a wet-strippable hardmask to prevent damage to structures after dopant implantation.

Description of the Related Art

It is frequently advantageous to have transistors with different dopant profiles on a single chip. For example, when n-type transistors and p-type transistors are formed on a single chip, the fabrication process needs to protect each transistor type during dopant implantation of the opposing type.

However, existing processes use a hardmask layer to selectively reveal one type of transistor structure for doping. The removal of this hardmask layer after the doping is complete can be destructive to the newly doped structures. For example, if the hardmask is removed using a reactive ion etch or hydrofluoric acid wet etch, the exposed structures would be damaged by the loss of an oxide liner or dopant from the structures, resulting in lower electrical performance. To prevent this damage, existing processes use a separate protective layer over the doped structures while the hardmask is removed. This protective layer increases the complexity and cost of the fabrication process.

SUMMARY

A method for forming a semiconductor device includes forming a wet-strippable hardmask over semiconductor fins. The wet-strippable hardmask is anisotropically etched away in a first device region. At least one semiconductor fin is doped in the first device region. The wet-strippable hardmask is isotropically etched away in a second device region. Semiconductor devices are formed from the fins in the first and second device regions.

A method for forming a semiconductor device includes forming a wet-strippable hardmask over semiconductor fins. The wet-strippable hardmask is formed from a material selected from the group consisting of a metallic carbon oxide and a metallic carbon oxynitride comprising a metallic element selected from the group consisting of titanium, hafnium, tungsten, and zirconium. The wet-strippable hardmask is anisotropically etched away in a first device region. At least one semiconductor fin in the first device region is doped. The wet-strippable hardmask is isotropically etched away in a second device region with a wet chemical etch. Semiconductor devices are formed from the plurality of fins in the first and second device regions.

A method for forming a semiconductor device includes forming an organic planarizing layer over semiconductor fins. A wet-strippable hardmask is formed over the organic planarizing layer. The wet-strippable hardmask is formed from a material selected from the group consisting of a metallic carbon oxide and a metallic carbon oxynitride comprising a metallic element selected from the group consisting of titanium, hafnium, tungsten, and zirconium. The wet-strippable hardmask is anisotropically etched away in a first device region. The organic planarizing layer is anisotropically etched away in the first region. At least one semiconductor fin in the first device region is doped. The wet-strippable hardmask is isotropically etched away in a second device region with a wet chemical etch. The organic planarizing layer in the second device region is removed. Semiconductor devices are formed from the plurality of fins in the first and second device regions.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention use a wet strippable hardmask that can be removed using relatively gentle processes, thereby preventing damage to exposed structures and simplifying the fabrication process. In particular, it is contemplated that the wet-strippable hardmask may be formed from a metallic carbon oxide or a metallic carbon oxynitride that can be removed at, or close to, room temperature using a wet chemical etch.

Figure 1:
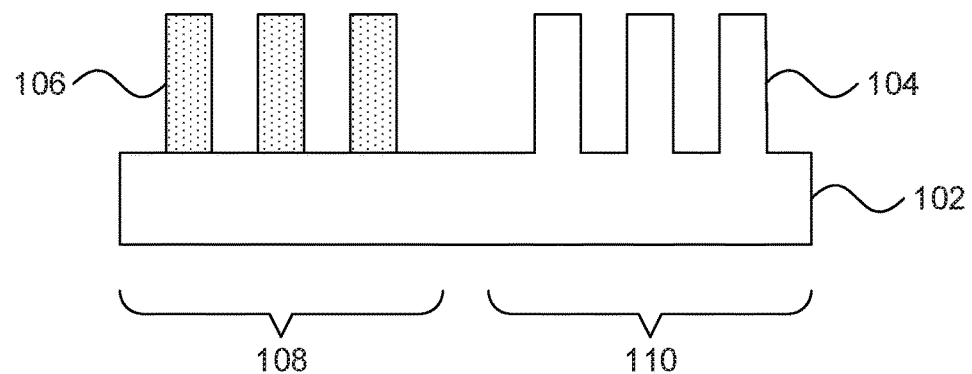
FIG. 1 is a cross-sectional diagram of a step in the formation of semiconductor devices that shows fins in two distinct device regions in accordance with an embodiment of the present invention.

Referring now to the drawings in which like numerals represent the same or similar elements and initially to FIG. 1, a cross-sectional view of a step in the fabrication of fin field effect transistors (finFETs) is shown. It should be understood that, although the present embodiments are described with a particular focus on finFETs, the present principles may alternatively be applied to other device structures, including for example planar FETs and vertical FETs. Two device regions are shown: a first device region 108 and a second device region 110. Each device region will have a distinct structure, as described below.

It is specifically contemplated that the first device region may be used to form a p-type transistor while the second device region 110 may be used to form an n-type transistor. It should be understood that, although the first device region 108 and the second device region 110 are depicted as being adjacent to one another, in practice these regions could be formed anywhere on the semiconductor substrate 102 and may have one or more intervening regions or structures, including in particular a shallow trench isolation region (not shown).

First semiconductor fins 104 and second semiconductor fins 106 are formed on a semiconductor substrate 102. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

Alternative embodiments may employ a III-V compound semiconductor for the semiconductor substrate 102. The term "III-V compound semiconductor" denotes a semiconductor material that includes at least one element from Group III of the Periodic Table of Elements (i.e., International Union of Pure and Applied Chemistry (IUPAC) group 13) and at least one element from Group V of the Periodic Table of Elements (i.e., IUPAC group 15). This contrasts to group IV semiconductors which are formed from a single element in group IV of the Periodic Table of Elements (i.e., IUPAC group 14) such as, e.g., silicon, germanium, and compounds thereof. Typically, the III-V compound semiconductors are binary, ternary or quaternary alloys including III/V elements. Examples of III-V compound semiconductors that can be used in the present invention include, but are not limited to alloys of gallium arsenic, aluminum arsenic, indium gallium arsenic, indium aluminum arsenic, indium aluminum arsenic antimony, indium aluminum arsenic phosphorus, indium gallium arsenic phosphorus, cadmium telluride, zinc selenide, and combinations thereof.

The first semiconductor fins 104 and second semiconductor fins 106 may be formed from the semiconductor substrate 102 itself or may, alternatively, be etched from a layer of a distinct semiconductor material that is deposited on the semiconductor substrate. As such, the first semiconductor fins 104 and second semiconductor fins 106 may be formed from a same material as the semiconductor substrate 102 or from a different material. In one particular embodiment, the first semiconductor fins 104 may be formed from silicon and the second semiconductor fins 106 may be formed from silicon germanium.

The first semiconductor fins 104 and semiconductor fins 106 may be formed using any appropriate anisotropic etch process including, e.g., reactive ion etching (RIE). As used herein, an "anisotropic etch process" denotes a material removal process in which the etch rate in the direction normal to the surface to be etched is greater than in the direction parallel to the surface to be etched. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the first semiconductor fins 104 and second semiconductor fins 106 can be formed by sidewall image transfer, where spacers are conformally formed on a defining structure and are subsequently used as a mask to etch into an underlying layer, creating fins with dimensions much smaller than could be achieved directly through photolithography.

Figure 2:
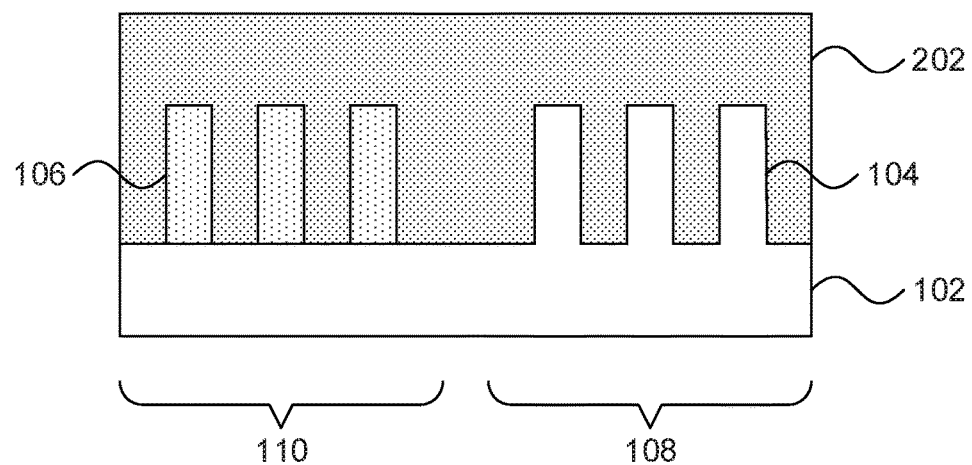
FIG. 2 is a cross-sectional diagram of a step in the formation of semiconductor devices that shows an organic planarizing layer being deposited over the fins in the two device regions in accordance with an embodiment of the present invention.

Referring now to FIG. 2, a cross-sectional view of a step in the fabrication of finFETs is shown. An organic planarizing layer 202 is deposited over the first semiconductor fins 104 and the second semiconductor fins 106. The organic planarizing layer 202 may be deposited by any appropriate process including, e.g., chemical vapor deposition (CVD), atomic layer deposition (ALD), physical vapor deposition (PVD), gas cluster ion beam (GCIB) deposition, or spin-on deposition. It is specifically contemplated that the organic planarizing layer 202 may be formed from a high-temperature material such as, e.g., a material with a high carbon content, including for example high aromatic content, to provide high thermal stability.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 3:
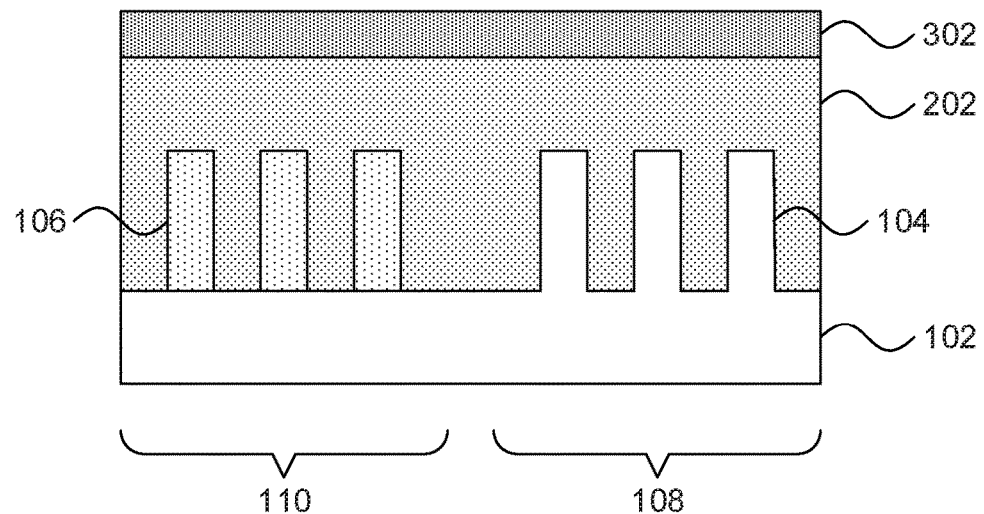
FIG. 3 is a cross-sectional diagram of a step in the formation of semiconductor devices that shows the formation of a wet-strippable hardmask over the organic planarizing layer in accordance with an embodiment of the present invention.

Referring now to FIG. 3, a cross-sectional view of a step in the fabrication of finFETs is shown. A wet-strippable hardmask layer 302 is deposited on the organic planarizing layer 202. The wet-strippable hardmask layer 302 is formed from any material that can be etched away using a relatively gentle process (using, e.g., "standard clean 1," a solution of 5 parts deionized water, one part aqueous ammonium hydroxide, and one part aqueous hydrogen peroxide, at a temperature between about 20° C. and about 80° C. for a duration between about 60 second and about 300 seconds). The wet-strippable hardmask layer 302 also performs the function of an anti-reflective coating in embodiments using deep ultraviolet lithography at 248 nm or 193 nm. Other forms of lithography can be performed where the anti-reflective properties are not needed.

Specific embodiments include a wet-strippable hardmask layer 302 that is formed from a metallic material based on, e.g., titanium, hafnium, tungsten, or zirconium. The metallic material may be, e.g., a metal carbon oxide or a metal carbon oxynitride having a carbon concentration of about 5% to about 15% and a metal concentration of about 40% to about 60%. These materials are resistant to high temperatures, exhibiting stability up to about 600° C. for certain titanium-based oxides. The wet-strippable hardmask may be formed by any appropriate deposition process including, e.g., CVD, PVD, ALD, GCIB deposition, or a spin-on process.

Figure 4:
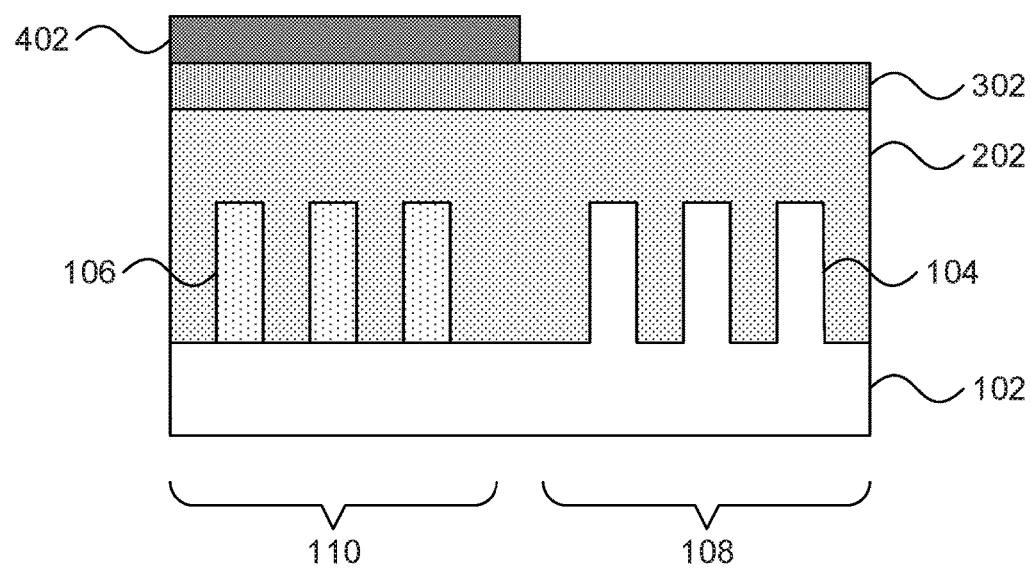
FIG. 4 is a cross-sectional diagram of a step in the formation of semiconductor devices that shows a resist mask being formed on the wet-strippable hardmask in accordance with an embodiment of the present invention.

Referring now to FIG. 4, a cross-sectional view of a step in the fabrication of finFETs is shown. A resist mask 402 is formed over the wet-strippable hardmask layer 302. A layer of resist material is first deposited using any appropriate deposition process, such as CVD, PVD, ALD, GCIB deposition, or a spin-on process. An appropriate pattern of radiation is applied to the resist material, causing a chemical change in regions of the material exposed. A resist developer is then used to remove undesired portions of the resist material. In some cases the resist developer removes the exposed portions of resist material, while in other cases the resist developer removes the unexposed portions. What remains is the resist mask 402, which in the example depicted defines the first device region 108 by leaving that region uncovered.

Figure 5:
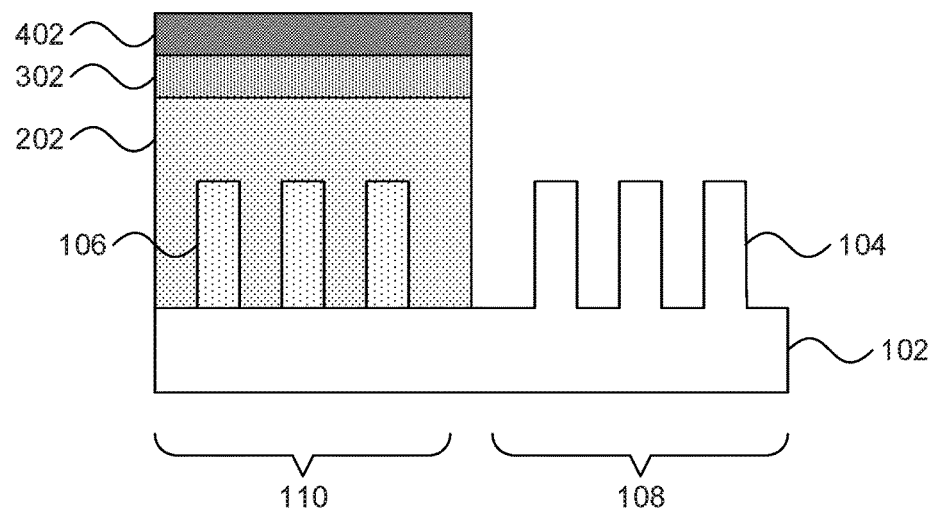
FIG. 5 is a cross-sectional diagram of a step in the formation of semiconductor devices that shows an anisotropic etch down to the fins in one of the device regions in accordance with an embodiment of the present invention.

Referring now to FIG. 5, a cross-sectional view of a step in the fabrication of finFETs is shown. A first anisotropic etch is used to etch the exposed region of the wet-strippable hardmask layer 302 and a second anisotropic etch is used to etch the exposed region of the organic planarizing layer 202, exposing the first semiconductor fins 104 in the first device region 104.

Figure 6:
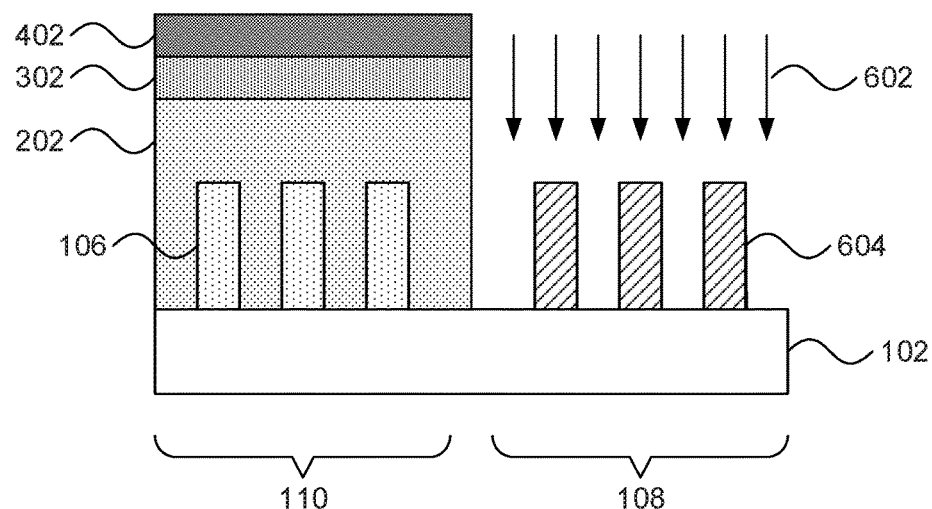
FIG. 6 is a cross-sectional diagram of a step in the formation of semiconductor devices that shows doping the exposed fins in accordance with an embodiment of the present invention.

Referring now to FIG. 6, a cross-sectional view of a step in the fabrication of finFETs is shown. A high-energy dopant implantation 602 is performed, turning the first semiconductor fins 104 into first doped semiconductor fins 604. The dopant used may be either an n-type dopant or a p-type dopant as appropriate to the type of device being formed in the first device region 108.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

It is specifically contemplated that the dopant implantation may be performed at a high temperature (e.g., above about 300° C.) to prevent amorphization of the semiconductor material. Thus even for high-energy implantation (e.g., using dopant ions having a kinetic energy greater than about 20 keV to a concentration of about $1 \times 10^{15}/cm^2$) the crystalline structure of the first semiconductor fins 104 will not be destroyed.

Figure 7:
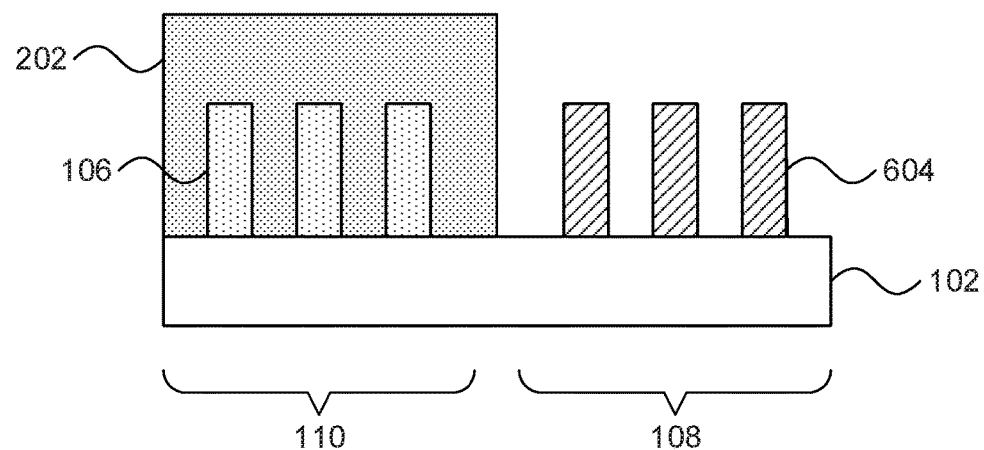
FIG. 7 is a cross-sectional diagram of a step in the formation of semiconductor devices that shows removal of the wet-strippable hardmask in a manner that does not damage the doped fins in accordance with an embodiment of the present invention.

Referring now to FIG. 7, a cross-sectional view of a step in the fabrication of finFETs is shown. The wet-strippable hardmask layer 302 is etched away using, e.g., the "standard clean 1" process (SC-1) described above. Because SC-1 is a relatively gentle wet etch, it does not cause significant damage to the first doped semiconductor fins 604 when removing the wet-strippable hardmask layer 302. It should be noted that the wet-strippable hardmask layer 302 can still be removed even after ion implantation, as shown in experimental trials using a titanium oxide based hardmask material.

Figure 8:
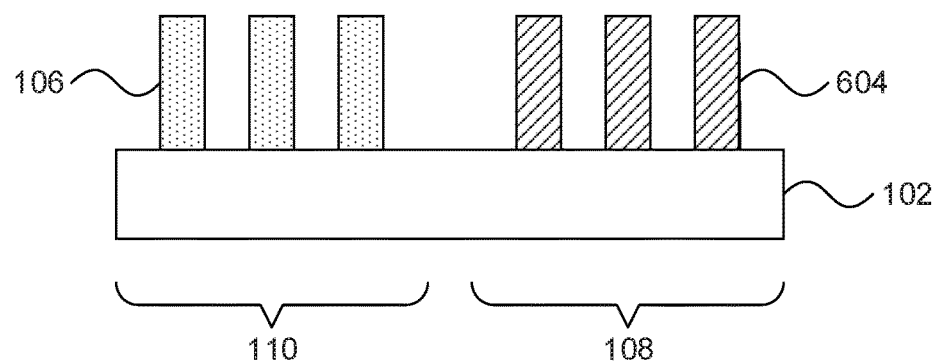
FIG. 8 is a cross-sectional diagram of a step in the formation of semiconductor devices that shows removal of the remaining organic planarizing layer in accordance with an embodiment of the present invention.

Referring now to FIG. 8, a cross-sectional view of a step in the fabrication of finFETs is shown. The remaining material of the organic planarizing layer 202 is also selectively etched away using an isotropic etch that does not damage the first doped semiconductor fins 604 or the second semiconductor fins 106. At this stage the process can be repeated to apply a different dopant to the second semiconductor fins. The device can then be finished by forming, e.g., source/drain regions, a gate stack, a passivating layer, and electrical contacts.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 9:
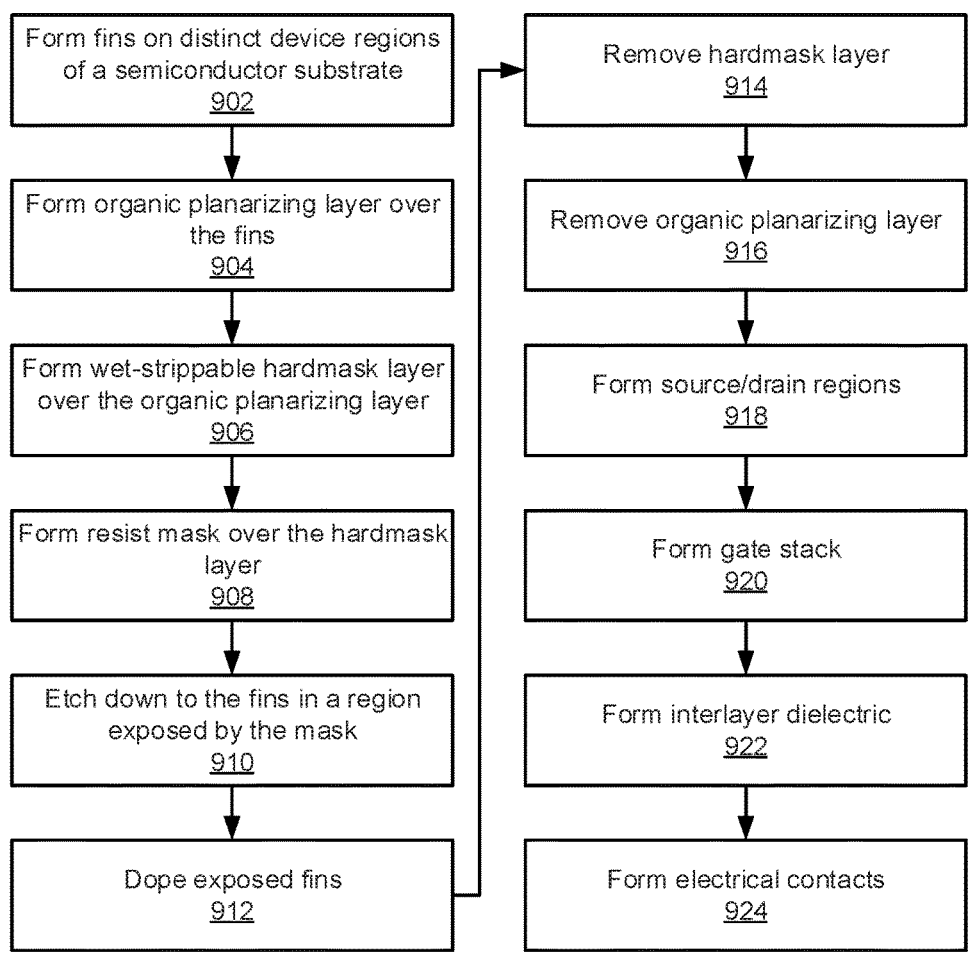
FIG. 9 is a block/flow diagram of a method for forming semiconductor devices in accordance with an embodiment of the present invention.

Referring now to FIG. 9, a method of forming finFETs is shown. Block 902 forms the first semiconductor fins 104 and the second semiconductor fins 106 on the first device region 108 and the second device region 110 of the semiconductor substrate 102 respectively using any appropriate anisotropic etching process. As noted above, the first semiconductor fins 104 and the second semiconductor fins 106 can be formed from the same semiconductor material or from different materials and may, in one embodiment, be formed from silicon and silicon germanium respectively.

Block 904 forms the organic planarizing layer 202 over the fins by any appropriate deposition process. Block 906 then forms the wet-strippable hardmask layer 302 over the organic planarization layer 202. It is specifically contemplated that the wet-strippable hardmask layer 302 may be formed from a metallic material such as a metallic carbon oxide or a metallic carbon oxynitride.

Block 908 forms a resist mask 402 over the wet-strippable hardmask layer 302 and block 910 patterns the wet-strippable hardmask layer 302 and the underlying organic planarizing layer 202 in one or more anistotropic etches to expose the first semiconductor fins 104. Block 912 then dopes the exposed first semiconductor fins 104 using a high-energy dopant implantation.

Block 914 removes the wet-strippable hardmask layer using an etch that does not damage the first doped semiconductor fins 602 such as, e.g., SC-1. Block 916 then removes the remaining material of the organic planarizing layer 202 to expose the second semiconductor fins 106.

At this point the transistor can be completed. Block 918 forms source/drain regions around a channel region of one or more fins, block 920 forms a gate stack over the channel region (e.g., using a dummy gate and replacement gate process) block 922 forms an interlayer dielectric from a passivating material such as, e.g., silicon dioxide, and block 924 forms electrical contacts to the source, drain, and gate. It should be noted that the devices in the first device region 108 and the second device region 110 may differ in terms of device type (e.g., n-type vs. p-type), type of dopant used, dopant concentration, or other qualities.

Having described preferred embodiments of simplified block patterning with wet strippable hardmask for high-energy implantation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
    forming a wet-strippable hardmask over a plurality of semiconductor fins from a material selected from the group consisting of a carbon oxide comprising a metal and a carbon oxynitride comprising a metal;
anisotropically etching away the wet-strippable hardmask in a first device region;
doping at least one semiconductor fin in the first device region;
isotropically etching away the wet-strippable hardmask in a second device region; and
forming semiconductor devices from the plurality of fins in the first and second device regions.

2. The method of claim 1, wherein the wet-strippable hardmask comprises a metallic element selected from the group consisting of titanium, hafnium, tungsten, and zirconium.

3. The method of claim 1, wherein isotropically etching away the wet-strippable hardmask comprises a wet chemical etch.

4. The method of claim 3, wherein the wet chemical etch is an etch in a solution of five parts deionized water, one part aqueous ammonium hydroxide, and one part aqueous hydrogen peroxide, at a temperature between about 20° C. and about 80° C. for about ten minutes.

5. The method of claim 1, further comprising forming an organic planarizing layer over the semiconductor fins before forming the wet-strippable hardmask.

6. The method of claim 5, further comprising removing the organic planarizing layer after isotropically etching away the wet-strippable hardmask in the second device region.

7. The method of claim 5, further comprising anisotropically etching away the organic planarizing layer in the first device region after anisotropically etching away the wet-strippable hardmask in the first device region.

8. The method of claim 1, wherein doping the at least one semiconductor fin in the first device region comprises a high-energy ion implantation doping process using implantation temperatures of about 300° C. or greater.

9. The method of claim 1, further comprising repeating said forming, anisotropically etching, doping, and isotropically etching, with said repeated anisotropic etching and said repeated doping being performed in the second device region, and said repeated isotropic etching being performed in the first device region, wherein said repeated doping comprises doping at least one semiconductor fin in the second device region with a different dopant than a dopant which the at least one semiconductor fin the first device region is doped with.

10. The method of claim 1, wherein forming semiconductor devices comprises:
forming source and drain structures on source and drain regions of at least one of the plurality of fins;
forming a gate stack on a channel region of the at least one of the plurality of fins;
forming an interlayer dielectric around the gate stack and source and drain structures; and
faulting electrical contacts to the source and drain structures and the gate stack.

11. A method for forming a semiconductor device, comprising:
forming a wet-strippable hardmask over a plurality of semiconductor fins, the wet-strippable hardmask being formed from a material selected from the group consisting of a metallic carbon oxide and a metallic carbon oxynitride comprising a metallic element selected from the group consisting of titanium, hafnium, tungsten, and zirconium;
anisotropically etching away the wet-strippable hardmask in a first device region;
doping at least one semiconductor fin in the first device region;
isotropically etching away the wet-strippable hardmask in a second device region with a wet chemical etch; and
forming semiconductor devices from the plurality of fins in the first and second device regions.

12. The method of claim 11, wherein the wet chemical etch is an etch in a solution of five parts deionized water, one part aqueous ammonium hydroxide, and one part aqueous hydrogen peroxide, at a temperature between about 20° C. and about 80° C. for about ten minutes.

13. The method of claim 11, further comprising forming an organic planarizing layer over the semiconductor fins before forming the wet-strippable hardmask.

14. The method of claim 13, further comprising removing the organic planarizing layer after isotropically etching away the wet-strippable hardmask in the second device region.

15. The method of claim 13, further comprising anisotropically etching away the organic planarizing layer in the first device region after anisotropically etching away the wet-strippable hardmask in the first device region.

16. The method of claim 11, wherein doping the at least one semiconductor fin in the first device region comprises a high-energy ion implantation doping process using implantation temperatures of about 300° C. or greater.

17. The method of claim 11, further comprising repeating said forming, anisotropically etching, doping, and isotropically etching, with said repeated anisotropic etching and said repeated doping being performed in the second device region, and said repeated isotropic etching being performed in the first device region, wherein said repeated doping comprises doping at least one semiconductor fin in the second device region with a different dopant than a dopant which the at least one semiconductor fin the first device region is doped with.

18. The method of claim 11, wherein forming semiconductor devices comprises:
forming source and drain structures on source and drain regions of at least one of the plurality of fins;
forming a gate stack on a channel region of the at least one of the plurality of fins;
forming an interlayer dielectric around the gate stack and source and drain structures; and
forming electrical contacts to the source and drain structures and the gate stack.

19. A method for forming a semiconductor device, comprising:
forming an organic planarizing layer over a plurality of semiconductor fins;
forming a wet-strippable hardmask over the organic planarizing layer, the wet-strippable hardmask being formed from a material selected from the group consisting of a metallic carbon oxide and a metallic carbon oxynitride comprising a metallic element selected from the group consisting of titanium, hafnium, tungsten, and zirconium;
anisotropically etching away the wet-strippable hardmask in a first device region;
anisotropically etching away the organic planarizing layer in the first region;
doping at least one semiconductor fin in the first device region;
isotropically etching away the wet-strippable hardmask in a second device region with a wet chemical etch;
removing the organic planarizing layer in the second device region; and forming semiconductor devices from the plurality of fins in the first and second device regions.

* * * * *